United States Patent
Chen et al.

[11] Patent Number: 6,080,663
[45] Date of Patent: Jun. 27, 2000

[54] DUAL DAMASCENE

[75] Inventors: Chih-Rong Chen, Chupei; Wen-Yuan Huang, Hsinchu Hsien, both of Taiwan

[73] Assignee: United Microelectronics Corp., Hsinchu, Taiwan

[21] Appl. No.: 09/191,297

[22] Filed: Nov. 13, 1998

[51] Int. Cl.[7] .................................................. H01L 21/4763
[52] U.S. Cl. .......................................... 438/637; 438/687
[58] Field of Search .................................... 438/640, 637, 438/638, 639, 672, 675, 622, 624, 734, 735, 738, 744, 783

[56] References Cited

U.S. PATENT DOCUMENTS

| | | | |
|---|---|---|---|
| 5,904,565 | 5/1999 | Nguyen et al. | 438/687 |
| 5,989,623 | 11/1999 | Chen et al. | 427/97 |
| 6,008,114 | 12/1999 | Li | 438/618 |
| 6,017,817 | 1/2000 | Chung et al. | 438/637 |

*Primary Examiner*—David Nelms
*Assistant Examiner*—Dung A Le
*Attorney, Agent, or Firm*—Charles C. H. Wu; Charles C. H. Wu & Associates, APC

[57] ABSTRACT

A dual damascene process is provided. A dielectric layer is formed on a substrate having a conductive region. The dielectric layer is selectively doped to form a doped region aligned over the conductive region. The doped region, the dielectric layer underlying the doped region, and another part of the undoped dielectric layer are etched until the conductive region is exposed, so that a dual damascene opening exposing the conductive region and a trench are formed, wherein the dual damascene opening comprising a upper trench and a lower via hole. The dual damascene opening and the trench are filled with a conductive layer.

13 Claims, 6 Drawing Sheets

DUAL DAMASCENE

BACKGROUND OF THE INVENTION

1. Field of the Invention

The invention relates in general to a method of forming a multilevel interconnect in an integrated circuit, and more particularly, to a dual damascene technique.

2. Description of the Related Art

An integrated circuit typically comprises various devices and components. These devices or components are typically insulated by an isolation structure. To electrically connect certain parts of the devices or components, an interconnect is commonly used. In the conventional method of manufacturing interconnects, a conductive layer is deposited over a substrate. A portion of the conductive layer is etched away to form a desired wiring pattern. The wiring pattern is then covered by an insulation layer to avoid any unwanted connected to other conductive layers, components, or devices. A vertical via hole is formed through the insulation layer to electrically connect the wiring layer. In general, an inter-metal dielectric (IMD) layer is used as an insulation layer to isolate the conductive layer from other conductive layer or wiring pattern. The connection between the conductive layer and other conductive layer or wiring pattern is achieved through a vertical via.

At present, two methods of fabricating interconnects such as plugs or vias are used in the semiconductor industry. The first method uses two separate stages for forming the interconnects. A dielectric layer is formed over a first conductive layer, and a photoresist layer is deposited over the dielectric layer. Etching techniques are used to form a via hole, and a conductive material is deposited into the via hole to form a via for electrical connection. A second conductive layer is deposited over the dielectric layer followed by a patterning process.

The second method is a dual damascene process. In the conventional dual damascene process, an insulation layer is first formed over a substrate structure followed by a planarizing process. According to the required wiring pattern and positions of vias, the insulating layer is etched to form horizontal trenches and vertical via holes. In other words, the lower portion of the insulating layer is etched to expose some of the device regions or portions of the metal lines below, thereby to form a vertical via hole. The upper portion of the insulating layer is also etched to form a horizontal trench. A conductive material is then deposited over the substrate structure to fill the horizontal trench and the via hole at the same. Chemical-mechanical polishing (CMP) method is used to planarize the surfaces of the devices, and then another dual damascene process can be carried out again. Since two metal-filling operations for filling the respective horizontal trenches and vertical via holes are combined into a single operation, the operation is referred to as a dual damascene process. Typically, the via is an interconnect between the underlying conductive region and the wiring pattern formed by filling conductive material into the horizontal trench.

FIG. 1A to FIG. 1G shows a conventional dual damascene process. In FIG. 1A, a substrate 100 comprising a conductive region 102 is provided. A silicon oxide layer 104 and a silicon nitride layer 106 are formed on the substrate 100. The silicon nitride layer 106 is functioned as a etch stop in the subsequent etching process. A photo-resist layer 108 is formed to expose a part of the silicon nitride layer 106 aligned over the conductive region 102. The exposed silicon nitride layer 106 is removed to form an opening 107 to expose a part of the silicon oxide layer 104 aligned over the conductive region 102. Being etched, the resultant silicon nitride layer is denoted as 106a.

In FIG. 1C, another silicon oxide layer 114 is formed by chemical vapor deposition (CVD) to cover the silicon nitride layer 106a and the silicon oxide layer 104.

In FIG. 1D, another photo-resist layer with a pattern 118 is formed over the silicon oxide layer 114. The photo-resist layer 118 has openings which expose part of the silicon oxide layer 114. The exposed parts of the silicon oxide layer 114 comprise the region aligned over the conductive region 102 of the substrate and another part for forming an interconnect trench.

In FIG. 1E, using dry etch with a high etching selectivity for silicon oxide against silicon nitride ($SiO_2$/SiN), the exposed parts silicon oxide layer 114 are removed to form trenches 120a and 122. The silicon oxide layer 104 exposed within the trench 120a is removed by dry etch with the same etching condition until the conductive region 102 is exposed, so that a via hole 120b is formed. Being etched, the resultant silicon oxide layer are denoted as 114a and 104a. The trench 120a and the via hole 120b are combined to form a dual damascene structured openings as 120.

In FIG. 1F, the photo-resist layer 118 is removed. A conformal glue/barrier layer is formed on each of the surfaces of the opening 120 and the trench 122. The opening 120 and the trench 122 are then filled with conductive layer 126 and 128 respectively to complete the dual damascene process.

While defining the opening 120, the profile thereof is determined by the pattern of the photo-resist layer 118 and the patterned silicon nitride layer 106a. In case of a misalignment as shown in FIG. 1G, the silicon oxide layer 114 exposed by the opening within the photo-resist is not aligned over the conductive region 102 precisely. As a consequence, the opening 120' formed by the trench 120a' and the via hole 120b' (shown in FIG. 1H) only exposes a part of the conductive region 102, so that the contact area of the interconnect 126' formed subsequently is reduced. The reduced contact area increases the contact resistance, and in contrast, reduces the conductivity of the interconnect 126'.

In addition to the above mentioned problem caused by misalignment, a higher fabricating cost is required for the conventional dual damascene process since two inter-metal layers (IMD), that is, two silicon oxide layers in this prior art technique and one silicon nitride layer for etch stop are required.

The silicon nitride layer has a dielectric constant higher than silicon oxide layer, therefore, a parasitic capacitor is easily induced. The internal stress of the silicon nitride layer is different from it of the silicon oxide layer. Moreover, the stress of the silicon nitride is tensile, while the stress of the silicon oxide is compressive. In the subsequent thermal process for metallization, a crack or a peeling effect at the side wall corner of the interface between the silicon nitride layer and the silicon oxide layer is easily caused. The quality of the device is thus degraded.

SUMMARY OF THE INVENTION

It is an object of the invention to provide a dual damascene process. Only one inter-metal dielectric layer is required. Using ion implantation, the etching rate of the inter-metal dielectric layer is altered to control the etched depth thereof. Only one etching process is performed for the dual damascene process. As a consequence, the fabrication cost is lowered and the process is simplified. Without the formation of the etch stop layer, the via hole and the trench are formed with a self-aligned property, so that the increased contact resistance caused by misalignment is resolved.

To achieve the above-mentioned objects and advantages, a dual damascene process is provided. A dielectric layer is formed on a substrate having a conductive region. The dielectric layer is selectively doped to form a doped region aligned over the conductive region. The doped region, the dielectric layer underlying the doped region, and another part of the undoped dielectric layer are etched until the conductive region is exposed, so that a dual damascene opening exposing the conductive region and a trench are formed, wherein the dual damascene opening comprising a upper trench and a lower via hole. The dual damascene opening and the trench are filled with a conductive layer.

Both the foregoing general description and the following detailed description are exemplary and explanatory only and are not restrictive of the invention, as claimed.

DESCRIPTION OF THE PREFERRED EMBODIMENTS

Figure 1A:
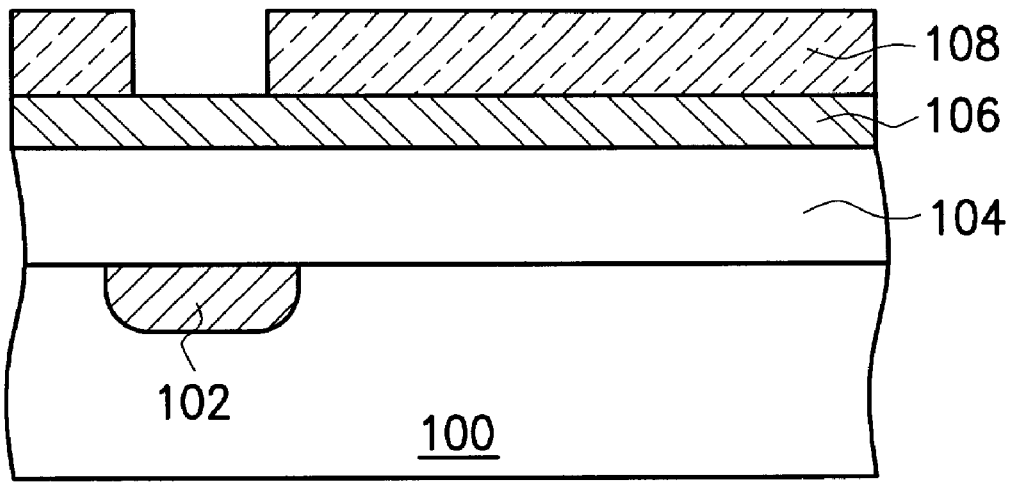
FIG. 1A to FIG. 1H shows a conventional method of dual damascene.
Figure 1B:
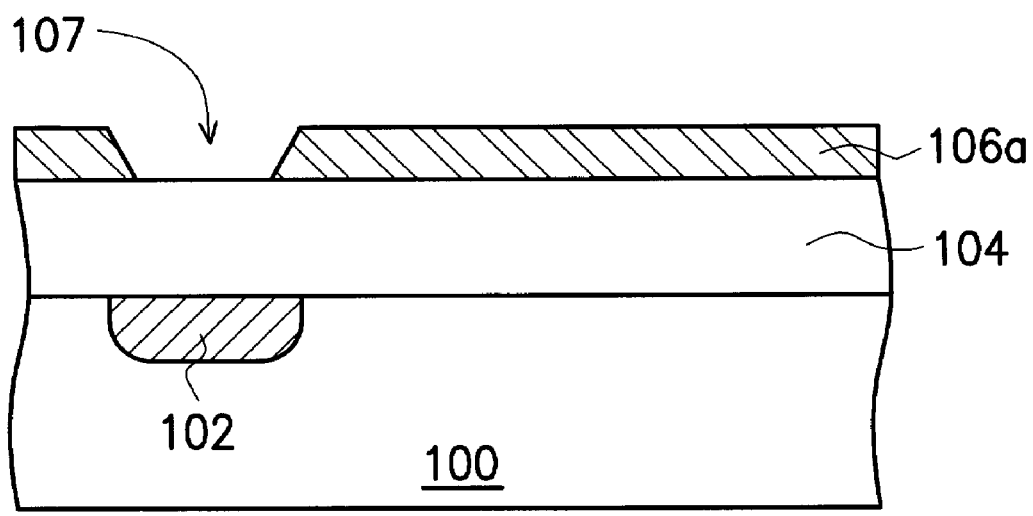
Figure 1C:
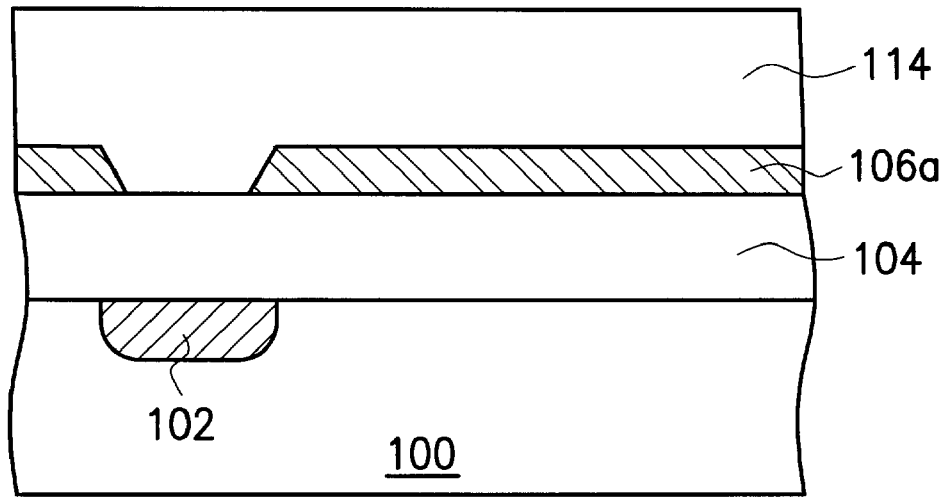
Figure 1D:
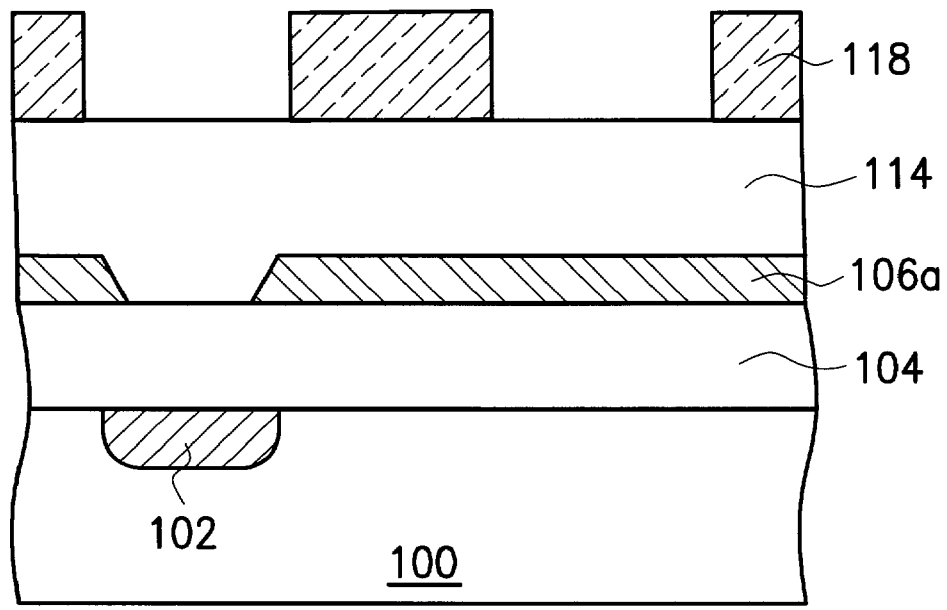
Figure 1E:
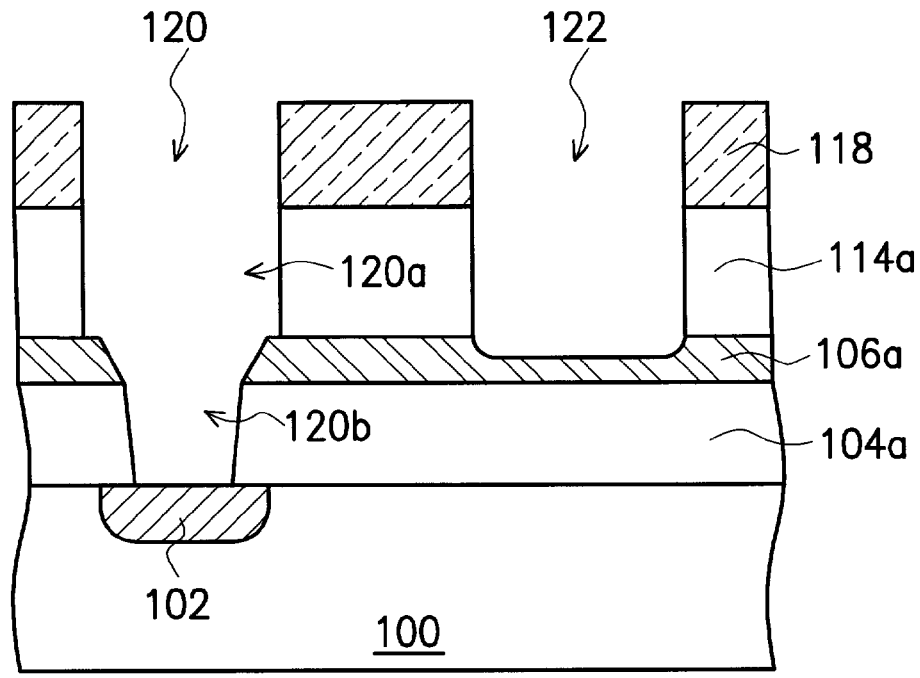
Figure 1F:
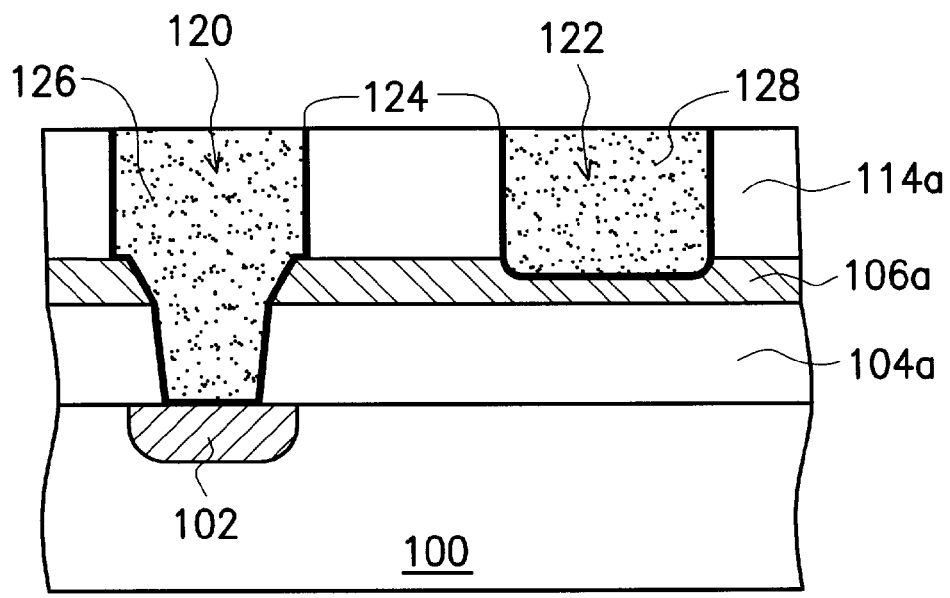
Figure 1G:
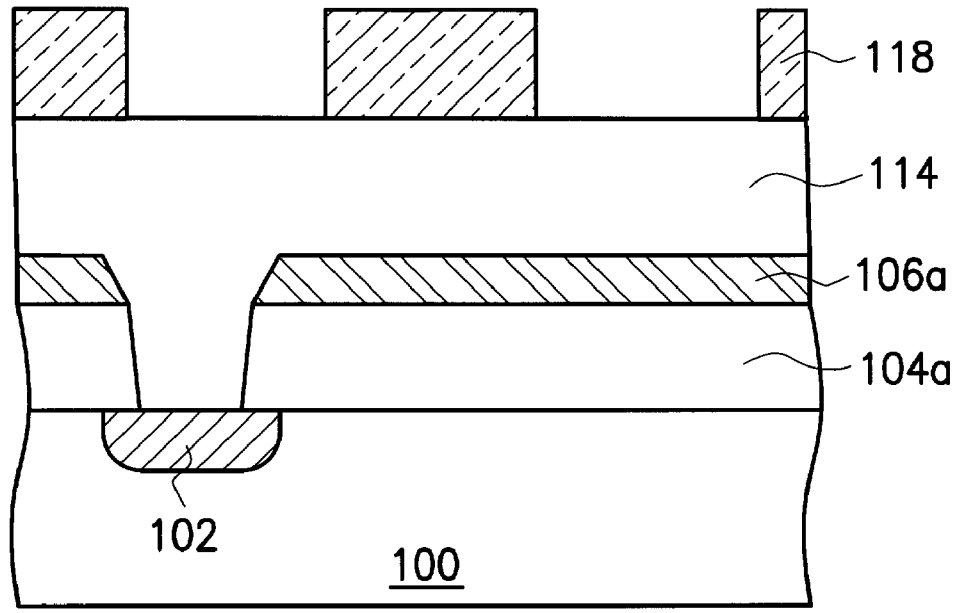
Figure 1H:
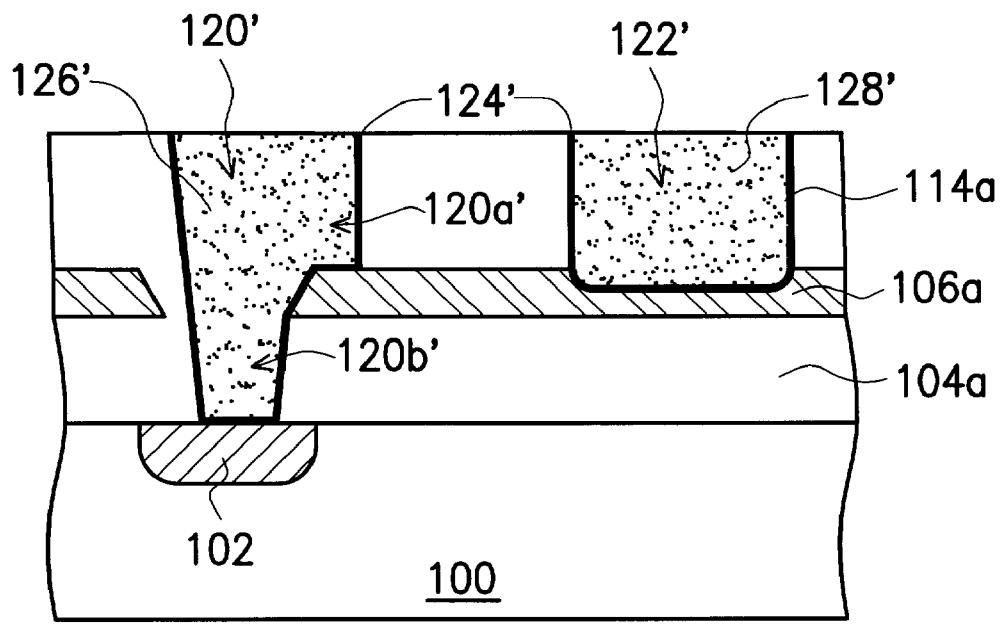
Figure 2A:
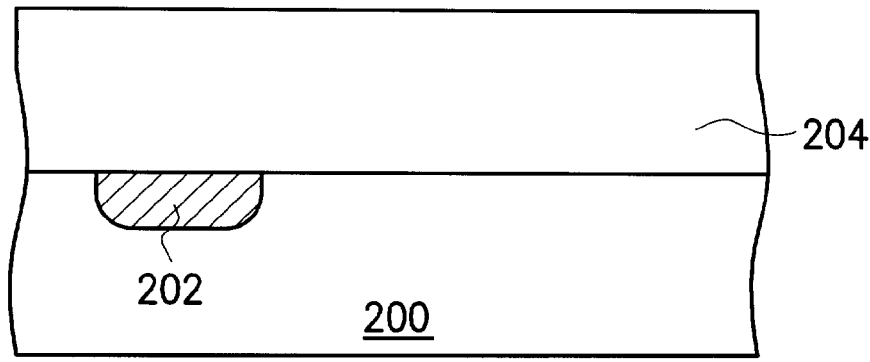
FIG. 2A to FIG. 2E shows a preferred embodiemnt of a dual damascene process according to the invention.

In FIG. 2A, a substrate 200 having a conductive region 202 is provided. The conductive region 202 may comprises a source/drain region of a transistor, a metal layer of a gate, or other interconnect pattern or layer. A dielectric layer 204 is formed, for example, a silicon oxide layer formed by chemical vapor deposition (CVD) or plasma enhanced CVD with a tetra-ethyl-ortho-silicate (TEOS) as a gas source. The dielectric layer 204 is planarized, preferably, by chemical mechanical polishing.

Figure 2B:
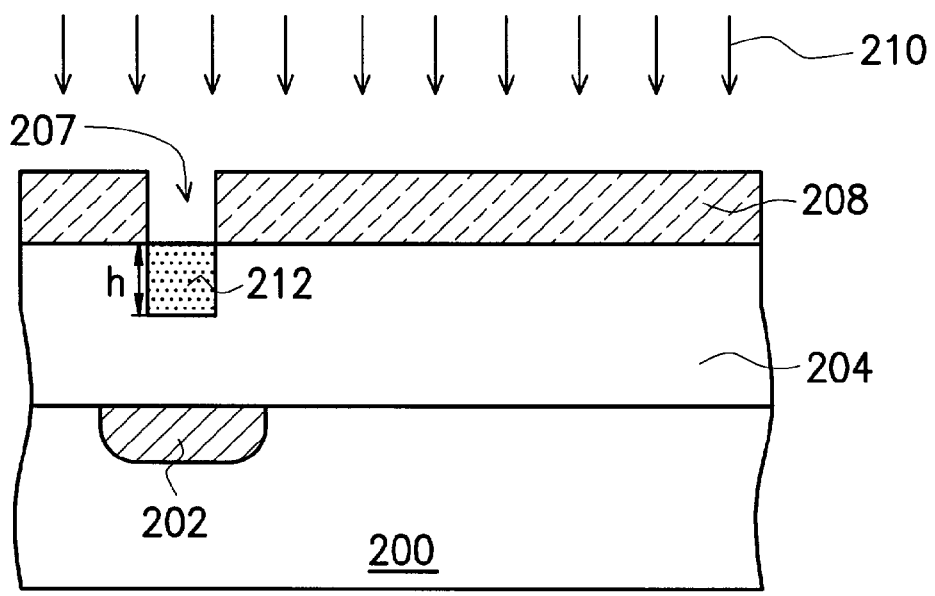

In FIG. 2B, a photo-resist layer 208 with an opening 207 aligned over the conductive region 202 is formed on the dielectric layer 204. The part of the dielectric layer 204 which is aligned over the conductive region 202 exposed within the opening 207 in a predetermined position for forming dual damascene opening. An ion implantation 210 is performed to form a doped region 212 in the predetermined position for forming dual damascene opening. The doped region 212 thus has an etching rate different from it of the other part of the dielectric layer 204. Preferably, argon ions (Ar$^+$) with a concentration of about $1.0 \times 10^{14}$/cm$^3$ are used as the implanted ions with an implanting energy of about 70 KeV. It is appreciated that people skilled in the art may perform the ion implantation with other ions or the same ions with different condition to achieve the objective of transforming the dielectric layer into a doped region with different etching rate according to specific requirements. The depth of the doped region is denoted as h. Under the doping condition mentioned above, the doped region has an etching rate twice of the other part of the dielectric layer 204. The photo-resist layer 208 is removed.

Figure 2C:
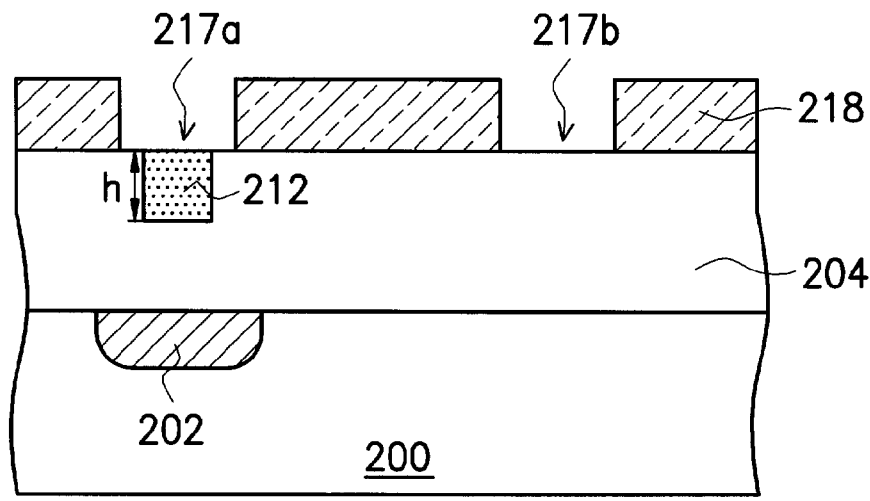

In FIG. 2C, another photo-resist layer 218 is formed on the dielectric layer 204. The photo-resist has openings 217a and 217b exposing the doped region 212 and another part of the dielectric layer 204. As mentioned above, the exposed dope region 212 is predetermined for forming a dual damascene opening, whereas the undoped dielectric layer 204 exposed within the opening 217b is determined for forming an interconnect trench. In this example, the opening 217a also exposes the periphery dielectric layer 204 of the doped regions since the upper part of the dual damascene opening is typically larger than the lower part thereof.

Figure 2D:
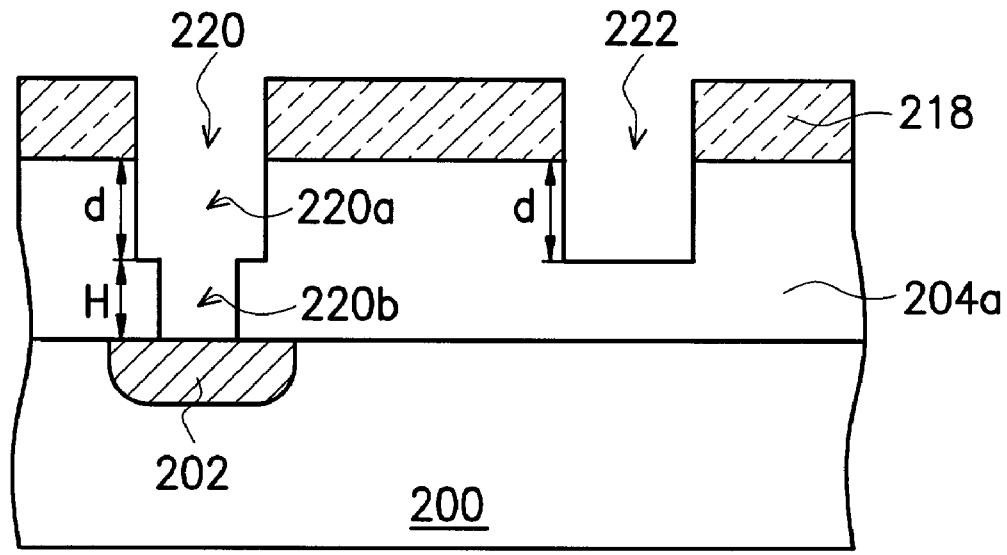

In FIG. 2D, using the photo-resist layer 218 as a mask, the doped region 212 and the undoped dielectric layer 204 exposed within the opening 217b are removed by etching, preferably, by a dry etch process, until the conductive region 202 of the substrate 200 is exposed. The etching rate of the doped region 212 is twice of it of the undoped part of the dielectric layer 204. Therefore, the doped region 212 is removed in a speed twice of the undoped part. As a consequence, a dual damascene opening 220 having a wider upper part 220a and a narrower part 220b, namely, a via hole, is formed. In addition to the dual damascene opening 220, an interconnect trench 222 is formed at the same time. Assuming that the depth of the upper part 220a of the dual damascene opening 220 and the trench 222 are both d, the depth of the via hole 220b is H, and the etching rate of the doped region 212 against the undoped part of the dielectric layer 204 is R, a relation is obtained as follow:

$$\frac{h}{R} + \frac{(H+d)-h}{1} = \frac{d}{1}$$

therefore, $$h = \frac{R}{R-1}H$$

The depth of the doped region 212, h, is calculated from the above equation. That is, the depth of the doped regions 212, h, is determined by the etching rate of the undoped dielectric layer 204 R and the required depth of the via hole H.

Figure 2E:
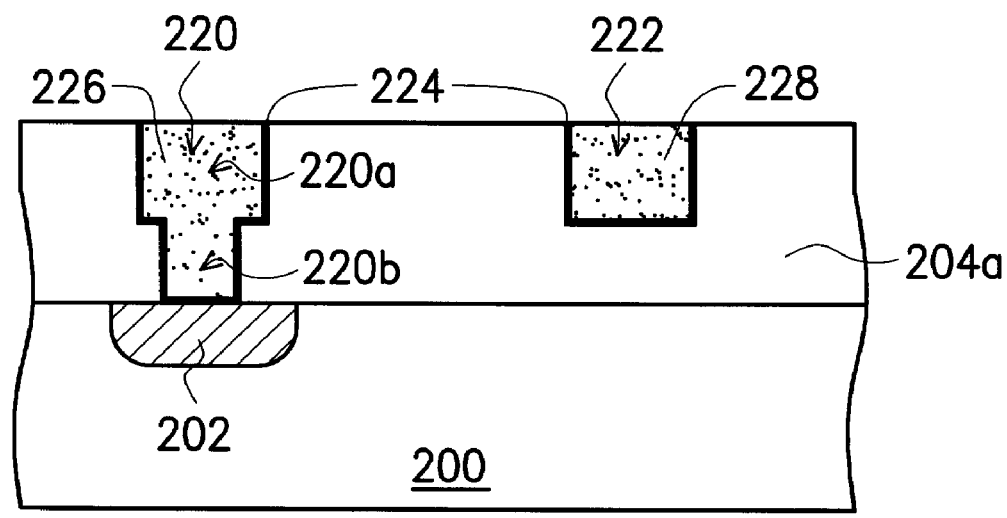

In FIG. 2E, a conformal glue/barrier layer 224, for example, a titanium/titanium nitride (Ti/TiN) or tantalum/tantalum nitride (Ta/TaN) layer, is formed to improve the adhesion and conductivity of the conductive layer formed subsequently. A conductive layer selected from copper, aluminum, aluminum-copper alloy, or other material is formed on the dielectric layer 204 and to fill the opening 220 and the trench 222. The conductive layer is then planarized to form interconnects 226 and 228.

In the invention, an ion implantation process is performed to transform a part of the dielectric layer into a doped region with a different etching rate. With the formation of the doped region, another dielectric layer and an etch stop layer formed in the conventional dual damascene process are not required. Thus, the fabrication process is simplified, and the fabrication cost is lowered.

With the formation of the doped region, the dual damascene interconnect is formed without an additional photolithography and etching process. That is, the dual damascene opening is formed by a self-aligned process. The problem caused by misalignment is thus prevented.

Without forming an etch stop layer, the formation of a parasitic capacitor is avoided. Furthermore, the mechanical problem such as crack and peeling due to the different stress of the etch stop and the dielectric layer is prevented too.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A dual damascene process, comprising:
    forming a dielectric layer on a substrate comprising a conductive region;

forming a first photo-resist layer with an opening exposing a part of the dielectric layer aligned over the conductive region;

performing an ion implantation with the photo-resist layer as a mask, so that a doped region aligned over the conductive region is formed;

removing the first photo-resist layer;

forming a second photo-resist layer with at least a first and a second openings, the first opening exposing the doped regions and the undoped dielectric layer at a periphery thereof, where the second opening exposing a part of the undoped dielectric layer; p1 removing the doped region, the dielectric underlying the doped region, and the exposed undoped dielectric layer until the conductive region is exposed, so that a dual damascene opening and a trench are formed; and filling the dual damascene opening and the trench with a conductive layer.

2. The process according to claim 1, wherein the step of ion implantation is performed by implanting argon ions.

3. The process according to claim 2, wherein the argon ions have a concentration of about $1.0 \times 10^{14}/cm^3$.

4. The process according to claim 2, wherein the ions are implanted with an energy of about 70 KeV.

5. The process according to claim 1, further comprising a step of forming a glue/barrier layer along a surface of each of the dual damascene opening and the trench before filling with a conductive layer.

6. A dual damascene process, comprising:

forming a dielectric layer on a substrate comprising a conductive region;

selectively implanting ions into a part of the dielectric layer to form a doped region aligned over the conductive region;

etching the doped region, the dielectric layer underlying the doped region, and another part of the undoped dielectric layer until the conductive region is exposed, so that a dual damascene opening exposing the conductive region and a trench are formed, wherein the dual damascene openign comprising an upper trench and a lower via hole; and filling the dual damascene opening and the trench with a conductive layer.

7. The process according to claim 6, wherein the doped region has an etching rate faster than the undoped dielectric layer.

8. The process according to claim 7, wherein the doped region has an etching rate twice faster than the undoped dielectric layer.

9. The process according to claim 6, wherein the upper trench is wider than the lower via hole.

10. The process according to claim 6, wherein assuming that the lower via hole has a depth of H and a ratio of etching rate of the doped region against the undoped dielectric layer is R, and doped region has a depth of h is determined by:

$$h = \frac{R}{R-1} H.$$

11. The process according to claim 6, wherein the ions includes argon ions.

12. The process according to claim 11, wherein the argon ions have a concentration of about $1.0 \times 10^{14}/cm^3$.

13. The process according to claim 6, wherein the ions are implanted with an energy of about 70 KeV.

* * * * *